(12) United States Patent
Kameshima

(10) Patent No.: US 6,795,525 B2
(45) Date of Patent: Sep. 21, 2004

(54) RADIATION DETECTING APPARATUS AND RADIOGRAPHING SYSTEM USING IT

(75) Inventor: Toshio Kameshima, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 36 days.

(21) Appl. No.: 10/176,058

(22) Filed: Jun. 21, 2002

(65) Prior Publication Data

US 2002/0196898 A1 Dec. 26, 2002

(30) Foreign Application Priority Data

Jun. 25, 2001 (JP) ............................. 2001-191786

(51) Int. Cl.$^7$ ............................................. H05G 1/64
(52) U.S. Cl. ............................. 378/98.8; 250/370.09
(58) Field of Search .................... 378/98.8, 19; 357/458; 250/370.09

(56) References Cited

U.S. PATENT DOCUMENTS

| | | | | |
|---|---|---|---|---|
| 5,457,322 A | * | 10/1995 | Kitaguchi | 250/370.06 |
| 6,185,274 B1 | * | 2/2001 | Kinno et al. | 378/98.8 |
| 6,528,794 B1 | * | 3/2003 | Sato | 250/370.09 |
| 6,608,312 B1 | * | 8/2003 | Okada et al. | 250/370.11 |

* cited by examiner

Primary Examiner—Craig E. Church
Assistant Examiner—Jurie Yun
(74) Attorney, Agent, or Firm—Fitzpatrick, Cella, Harper & Scinto

(57) ABSTRACT

A radiation detecting apparatus has a conversion element having a semiconductor layer for directly converting a radiation into a charge; and a variable voltage source for applying an electric field to the semiconductor layer, wherein the variable voltage source applies a voltage of a plurality of values as to apply at least electric fields in an identical direction and in different strengths.

23 Claims, 13 Drawing Sheets

HIGHER VOLTAGE OF VARIABLE VOLTAGE POWER SOURCE

LOWER VOLTAGE OF VARIABLE VOLTAGE POWER SOURCE

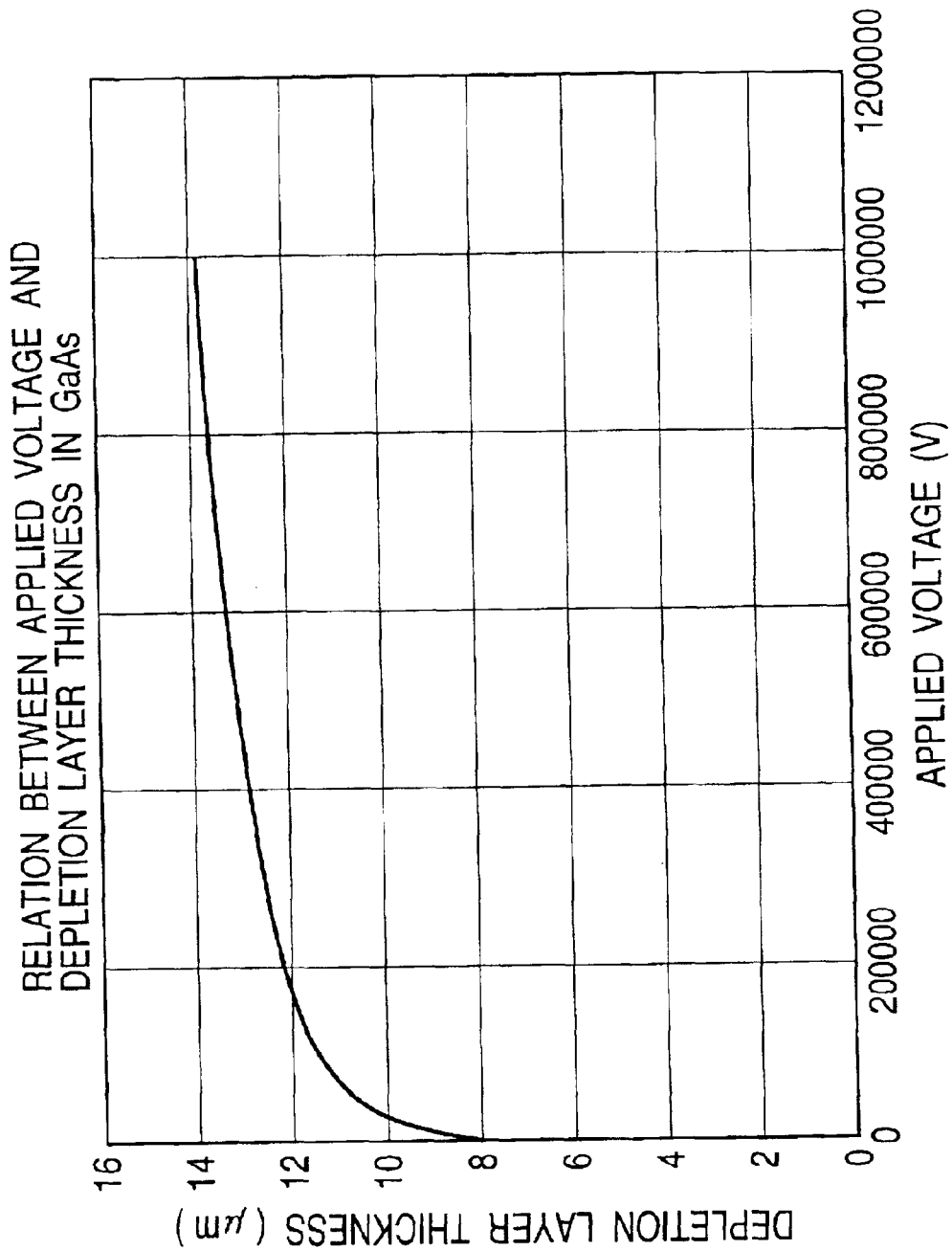

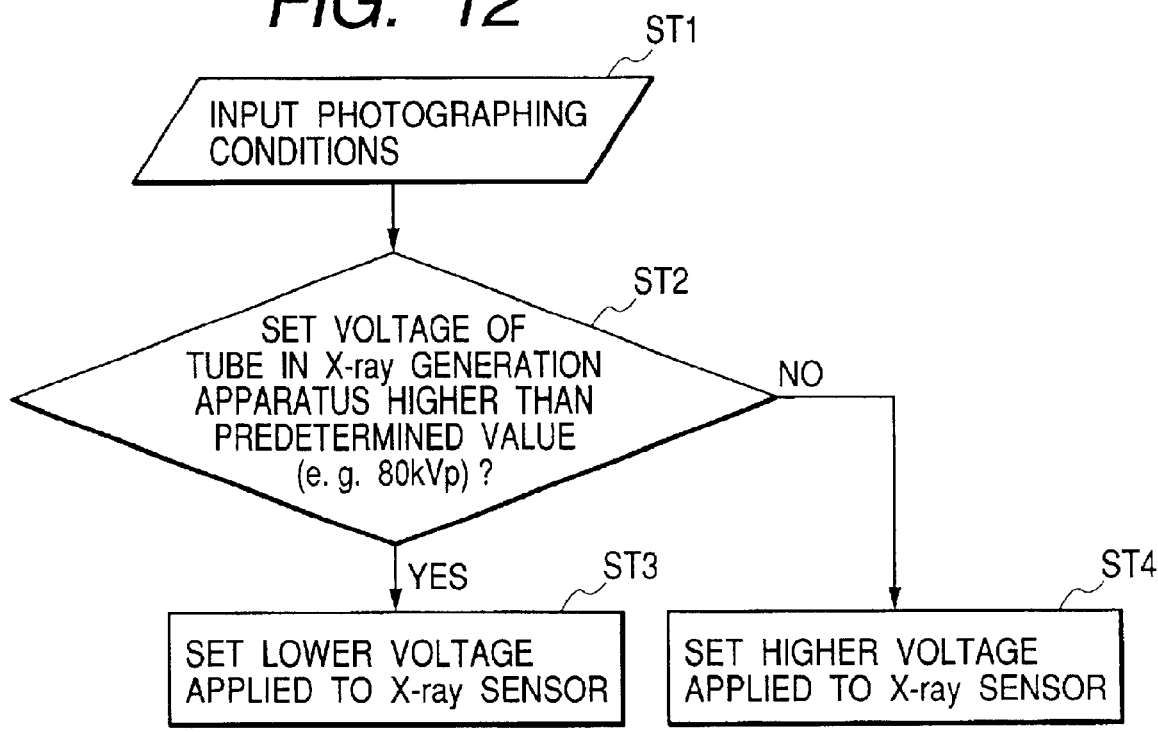
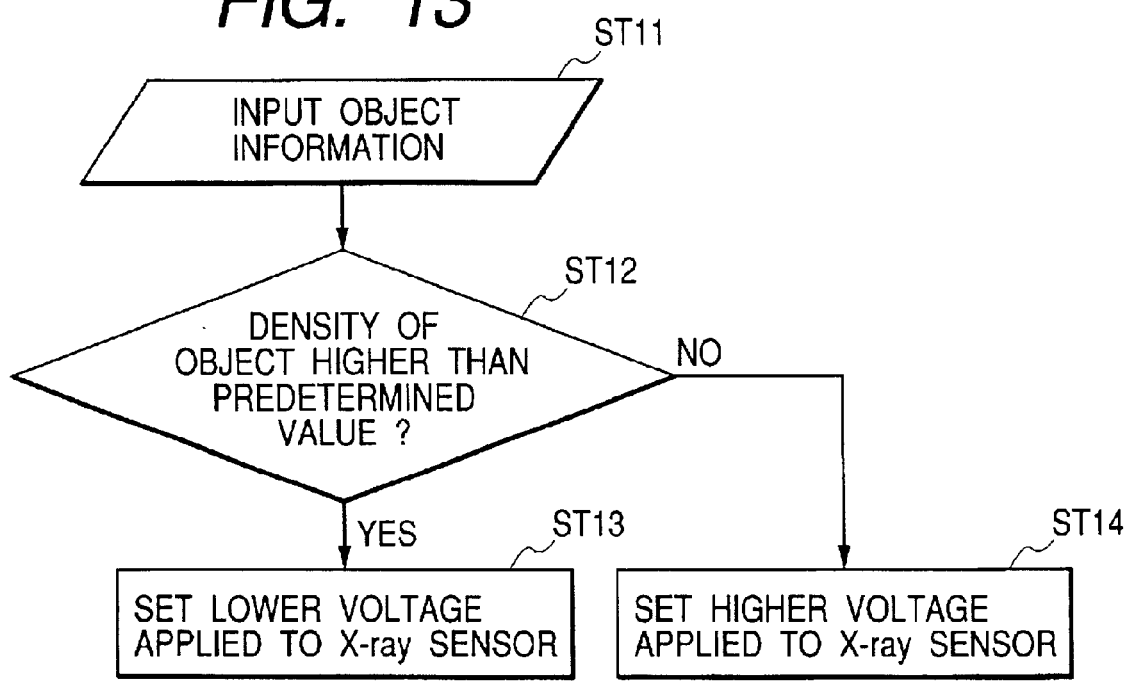

RADIATION DETECTING APPARATUS AND RADIOGRAPHING SYSTEM USING IT

BACKGROUND OF THE INVENTION

1. Field of the Invention

The present invention relates to radiation detecting apparatus used in X-ray photographing systems and others. In the present specification, description will be given on the presumption that the term "radiation" includes not only electromagnetic waves such as X-rays, γ-rays, and the like, but also α-rays and β-rays.

2. Related Background Art

FIG. 14 shows an example of a sectional view of a pixel in a conventional X-ray sensor (radiation detecting apparatus). FIG. 15 shows an example of a schematic circuit diagram of an X-ray sensor and FIG. 16 an example of an X-ray photographing system.

In the X-ray sensor shown in FIG. 14, a pixel is composed of an amorphous silicon photodiode 43 and a thin film transistor (TFT) 44. A phosphor layer 41 is placed above an X-ray incident surface, i.e., an upper surface of the photodiode 43 to convert X-rays to visible light. As shown in FIG. 15, pixels are arranged in a two-dimensional pattern and driven by matrix drive. Namely, the pixels are driven by a gate driver 22 connected to common gate lines and data is read out by a read circuit 21 connected to common data lines. The X-ray sensor in this illustration is comprised of the phosphor layer, amorphous silicon photodiodes, and TFTs, but some sensors can be comprised of the phosphor layer and CCDs. As shown in FIG. 16, X-rays carrying object information, having passed through an object 30, are read by the X-ray sensor 35.

Normally, X-rays having passed through an object consist of X-rays carrying effective object information, and scattered X-rays. It is generally known that the scattered X-rays due to the Compton effect or the like have low energy and cause degradation of image quality.

The reason for it is that the phosphor emits light when receiving the scattered X-rays of low energy from the object and information carried thereby is also read to cause the degradation of image quality.

In some X-ray photographing systems using the conventional X-ray sensor, a grid 34 for removal of scattered X-rays as shown in FIG. 16 is provided for reducing influence of the aforementioned scattered X-rays. In this structure, however, the grid appeared in images to degrade the quality of image in certain cases.

Namely, in order to achieve much higher image quality, it was necessary to solve the problems including the problem of degradation of image quality due to the scattered X-rays, the problem of appearance of the scattered X-ray removing grid in images, and so on.

SUMMARY OF THE INVENTION

An object of the present invention is therefore to provide radiation detecting apparatus capable of reducing the scattered X-rays to prevent the degradation of image quality and preventing increase in the radiation incident to an object.

In order to achieve the above object, the present invention provides a radiation detecting apparatus adapted to let a radiation into a semiconductor layer and read a charge generated thereby, wherein a depleted region in a semiconductor layer, which is depleted with application of an electric field, is controlled by a variable voltage source.

In another aspect X-rays having passed through an object are made incident into the apparatus from a side of a non-depleted region in the semiconductor layer. Further, the non-depleted region has a function of absorbing scattered X-rays of low energy.

BRIEF DESCRIPTION OF THE DRAWINGS

FIG. 3 is a graph to illustrate the operation of the X-ray sensor of the present invention (the relation between applied voltage and depletion layer);

FIG. 12 is a control flowchart of the X-ray photographing system in the sixth embodiment of the present invention;

FIG. 13 is a control flowchart of the X-ray photographing system in the sixth embodiment of the present invention;

DETAILED DESCRIPTION OF THE PREFERRED EMBODIMENTS

Embodiments of the present invention will be described below with reference to the drawings.

(First Embodiment)

Figure 1:
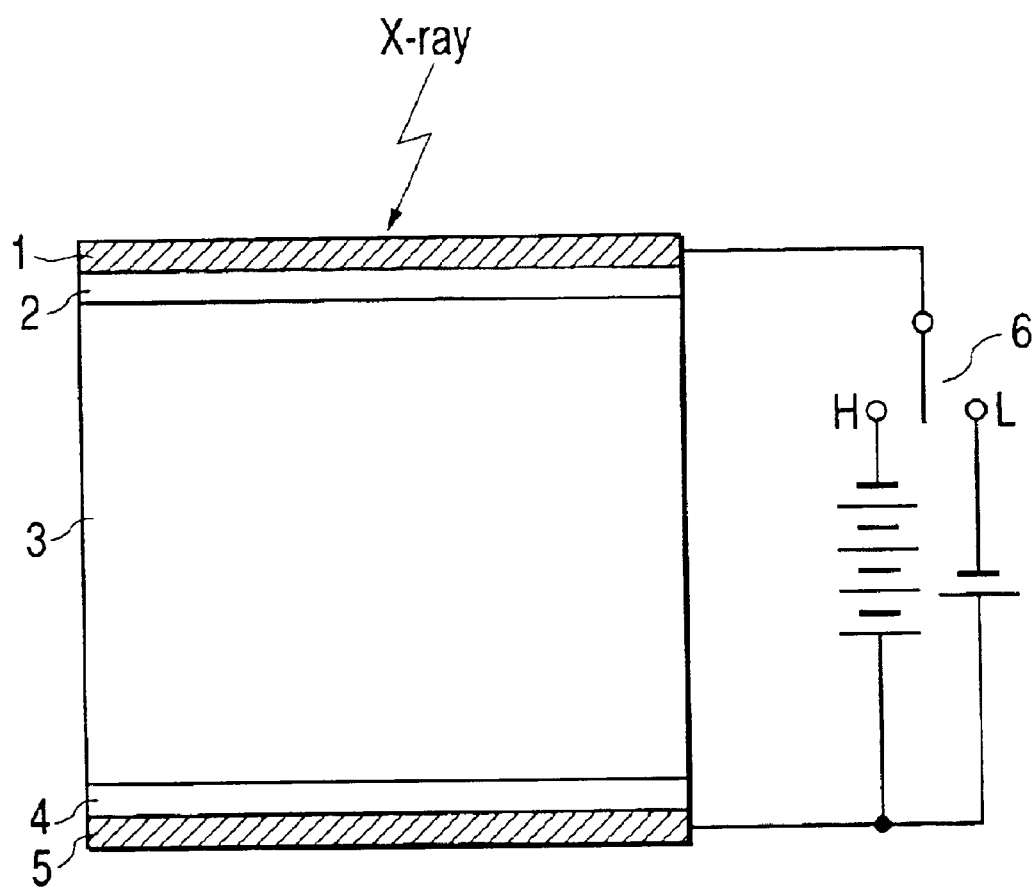
FIG. 1 is a sectional view of a pixel in an X-ray sensor in the first embodiment of the present invention.
Figure 2A:
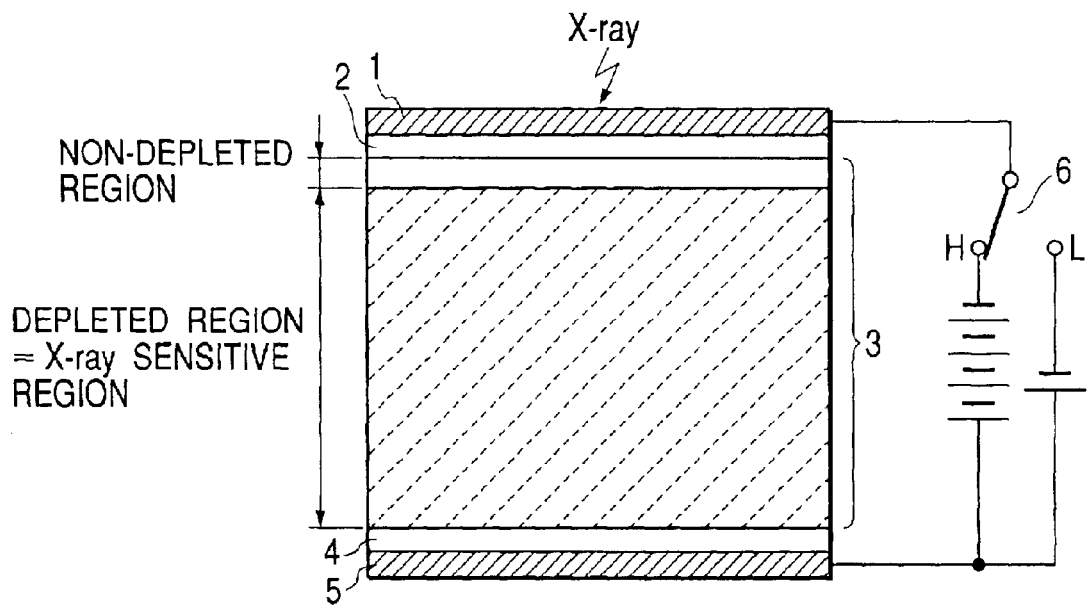
FIGS. 2A and 2B are sectional views showing states of the X-ray sensor depending upon applied voltages in the first embodiment of the present invention.
Figure 2B:
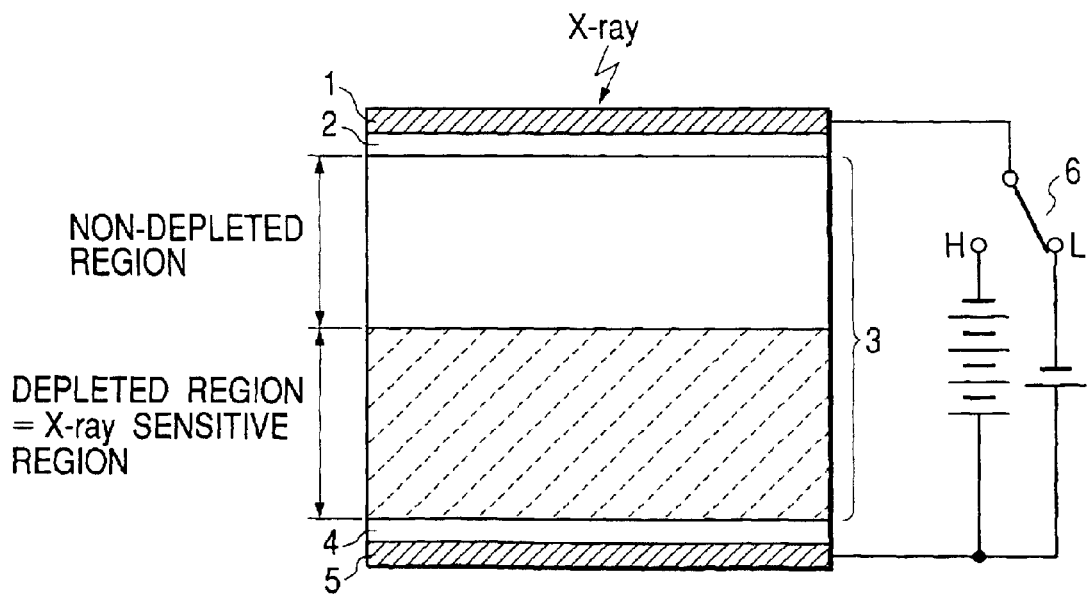
Figure 4:
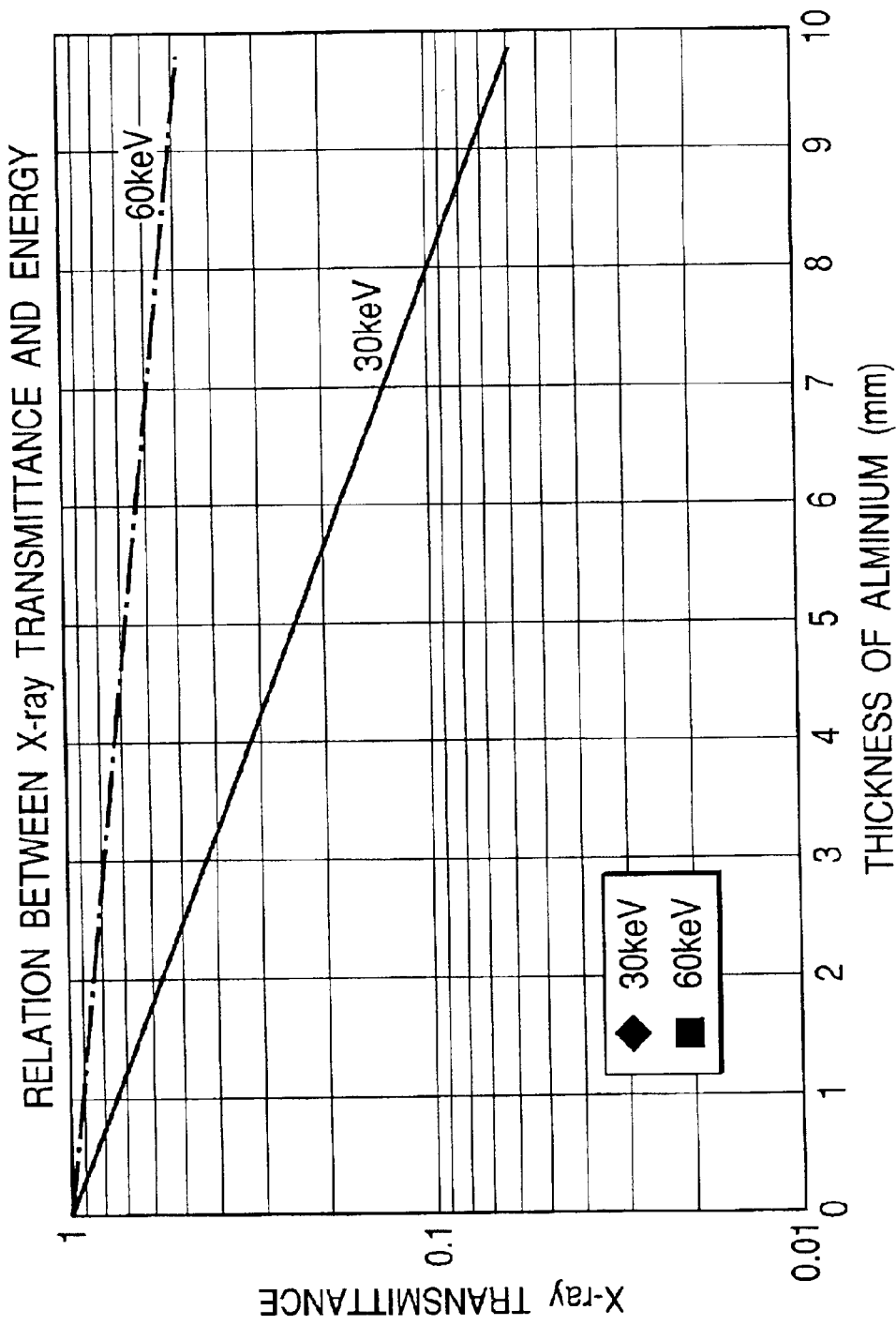
FIG. 4 is a graph to illustrate the operation of the X-ray sensor of the present invention (the relation between X-ray transmittance and energy)

FIGS. 1, 2A and 2B are sectional views of a pixel in the first embodiment of the X-ray sensor (radiation detecting apparatus) of the present invention. FIG. 3 shows the relation between applied voltage and thickness of a depletion layer, for explaining the operation of the X-ray sensor of the present invention. FIG. 4 shows the relation between X-ray energy and X-ray transmittance for aluminum, for explaining the operation of the present invention.

First, the principle of the X-ray sensor of the present embodiment will be described. In the X-ray sensor of the present embodiment, as shown in FIG. 1, the semiconductor layer is made of gallium arsenide. As illustrated, the sensor is constructed in a configuration of an upper electrode layer 1, a p-type gallium arsenide layer 2, a gallium arsenide semiconductor layer 3, an n-type gallium arsenide layer 4, and a lower electrode layer 5 arranged in the order named from the X-ray incident surface. In the X-ray sensor of the present embodiment, the upper electrode layer 1 and lower electrode layer 5 are further connected to a variable voltage source 6. The variable voltage source 6 applies an electric field in a direction to deplete the gallium arsenide semiconductor layer 3, i.e., in a reverse bias direction. X-rays incident into the depleted semiconductor layer are absorbed to generate hole-electron pairs according to an amount of X-rays. The holes and electrons thus generated migrate under the electric field so that the holes move toward the upper electrode 1 while the electrons move toward the lower electrode 5, so as to be read as a signal by a read circuit (omitted from the illustration). X-rays absorbed in a non-depleted semiconductor region also generate hole-electron pairs, but are not read as a signal, because the electric field is weak. Namely, it is considered that the depletion layer region has sensitivity to X-rays but the non-depleted region has no sensitivity to X-rays. In the present embodiment gallium arsenide is used as a semiconductor material, but it is also possible to use other materials, for example, amorphous selenium, mercury iodide, lead iodide, gallium phosphide, CdZn, CdZnTe, and so on.

As shown in FIG. 3, the thickness of the depletion layer is dependent upon the voltage applied to the semiconductor layer. In the present embodiment the thickness of the depletion layer is proportional to the logarithm of applied voltage. As shown in FIG. 4, the X-ray transmittance is dependent upon the wavelength, and X-rays of low energy (30 keV herein) are lower in transmittance, i.e., are absorbed more than X-rays of high energy (60 keV). FIG. 4 shows an example of aluminum, and a like tendency is also demonstrated by such materials as gallium arsenide, amorphous selenium, mercury iodide, lead iodide, gallium phosphide, CdZn, CdZnTe, and so on. This indicates that when X-rays are incident into the aforementioned semiconductor materials, X-rays of low energy are absorbed at a greater ratio near the incident surface. Since the scattered X-rays in the object due to the Compton effect or the like include a number of low energy components, the scattered X-rays of low energy are absorbed at a greater ratio near the incident surface of the semiconductor material.

The operation of the present embodiment will be described below referring to FIGS. 2A and 2B. The variable voltage source 6 is configured so as to permit settings of at least two applied voltages. Namely, the variable voltage source 6 can be used while being switched between a state of a high voltage setting to increase the depleted region as shown in FIG. 2A and a state of a lower voltage setting than that in FIG. 2A to decrease the depleted region as shown in FIG. 2B. For example, in the case where an object generates a relatively small amount of scattered X-rays of low energy, the object is photographed in the state of FIG. 2A. In the case where an object generates a relatively large amount of scattered X-rays on the other hand, the object is photographed in the state of FIG. 2B. When photography is done in the state of FIG. 2B, the scattered X-rays of low energy are mainly absorbed in the non-depleted region of the semiconductor layer near the incident surface (near the p-layer) to generate no signal. On the other hand, the X-rays of high energy carrying effective image information are mainly absorbed in the depleted region to generate a signal charge to be read out. The present embodiment permits the scattered X-rays responsible for the degradation of image quality to be absorbed in the non-depleted region on the p-layer side, thereby obtaining an excellent image. The depleted region is expanded from the side opposite to the incidence side of the radiation such as X-rays or the like, thereby reducing the influence of the scattered X-rays of low energy. The applied voltages establish respective electric fields in the same direction.

In the present embodiment the voltages are switched in two ways by the variable voltage source 6, but it is also possible to set voltages in finer steps. Since the energy level of X-rays can be readily determined by an X-ray tube voltage, the applied voltages may be adequately controlled on the basis of operator's judgment on energy values, or appropriate voltages may be set by monitoring energy values of incident X-rays with a phototimer (X-ray detector) and comparing the energy values with a threshold. In this case, the phototimer is desirably configured so as to be able to resolve photon energy levels determined by wavelengths (frequencies) of X-rays. In order to reduce the adverse effect of the scattered X-rays, it is preferable to set the voltages by the variable voltage source 6 so that the thickness of the non-depleted region becomes enough to absorb 50% or more of X-rays of energy of not more than 20 keV. The reason for it is as follows. The X-ray photography of a chest region, an abdominal region, or the like except for mammography is normally carried out at the tube voltages of not less than 50 kVp. It is known that in such photography a good image with less influence of scattered X-rays can be gained by absorbing 50% or more of X-rays of energy of not more than 20 keV.

The applied voltages can be lowered, for example, by placing a filmlike material of aluminum or the like, which absorbs the scattered X-rays, on the X-ray incidence side, thus enabling power saving.

In the present embodiment the sectional structure of the X-ray sensor was the structure having the p-layer, the semiconductor layer, and the n-layer from the side of incidence of X-rays, but it is also possible to employ the structure of the p-layer, the semiconductor layer, and an insulating layer in the order named.

As described above, the configuration of the present embodiment has realized the X-ray sensor capable of providing good images with less influence of scattered X-rays. Since there is no need for provision of the scattered X-ray removing grid, the configuration of the present embodiment can circumvent the problem of the grid image formed in X-ray images.

Points necessitating particular attention in the present embodiment are as follows. The voltages applied to the semiconductor layer can be switched by the variable voltage source to change the depletion layer region.

In addition, X-rays are made incident from the non-depleted region side of the semiconductor layer, i.e., from the p-layer side. In this case, the scattered X-rays can be absorbed to some extent by the non-depleted region without always having to employ the variable voltage configuration, whereby images can be obtained with less influence of the scattered X-rays.

(Second Embodiment)

Figure 5:
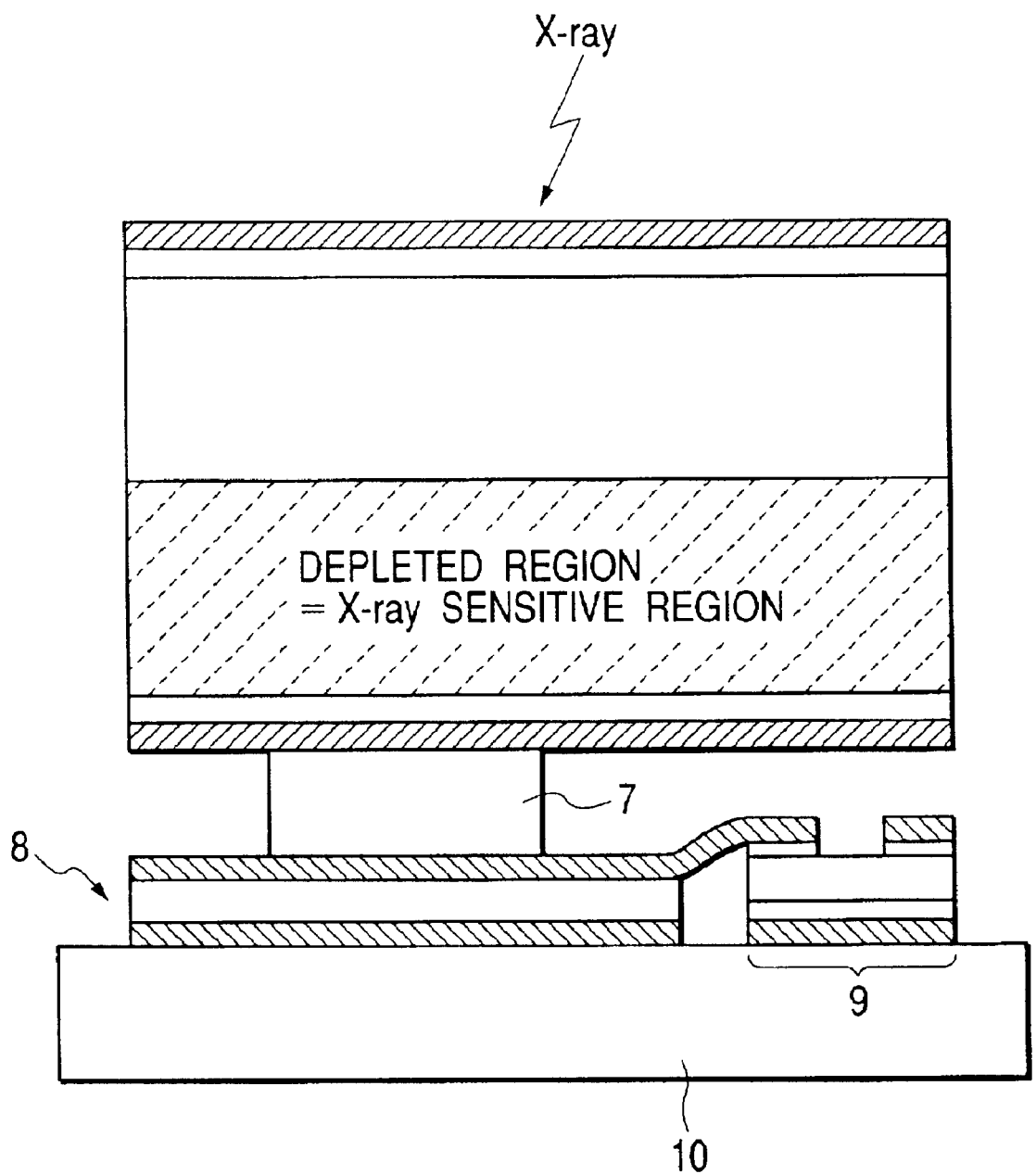
FIG. 5 is a sectional view of a pixel in an X-ray sensor in the second embodiment of the present invention.
Figure 6:
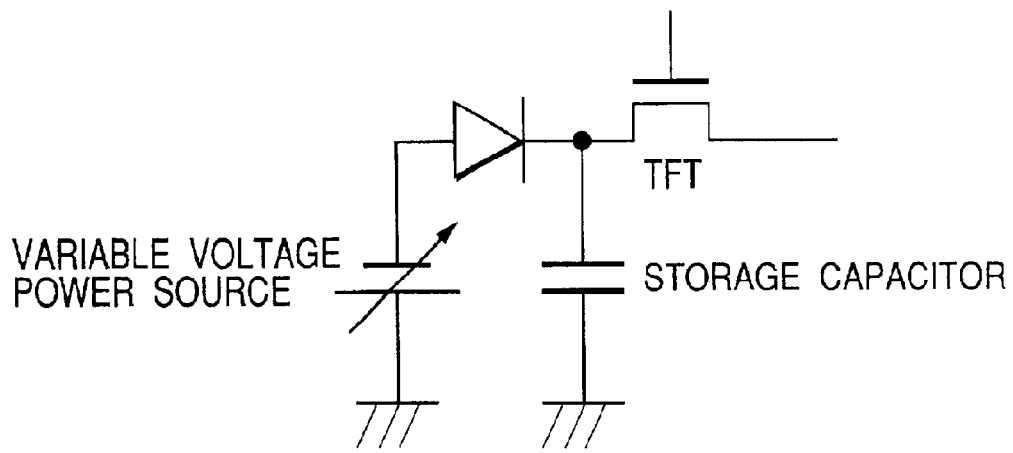
FIG. 6 is an equivalent circuit diagram of a pixel of the X-ray sensor in the second embodiment of the present invention.

The second embodiment of the present invention will be described below. FIG. 5 is a sectional view of the second embodiment of the X-ray sensor of the present invention. FIG. 6 is an equivalent circuit diagram of a pixel in the X-ray sensor of the second embodiment. The present embodiment is an example of the X-ray sensor having a switching device.

As shown in the sectional view of FIG. 5, the present embodiment is a configuration in which the X-ray sensor of the first embodiment is connected through a connecting bump 7 to a thin film transistor 9 and a storage capacitor 8 formed on a glass substrate 10. The operation of the part for receiving X-rays to generate a charge is similar to that in the first embodiment, and the upper electrode is connected to the variable voltage source (omitted from the illustration).

As shown in the equivalent circuit of FIG. 6, the lower electrode is connected to the storage capacitor and the drain electrode of the TFT. The gate electrode of the TFT is connected to a gate driving circuit (not shown). Further, the source electrode of the TFT is connected to the read circuit (not shown) or the like. The TFT and storage capacitor on the glass substrate can be deposited and formed by the amorphous silicon production process or the polysilicon production process used for liquid crystal displays and others. In this structure, an X-ray shielding member of lead or the like may be provided on the TFT, because X-rays having passed through the sensor part can conceivably be incident into the semiconductor layer of the TFT to cause a malfunction.

(Third Embodiment)

Figure 7:
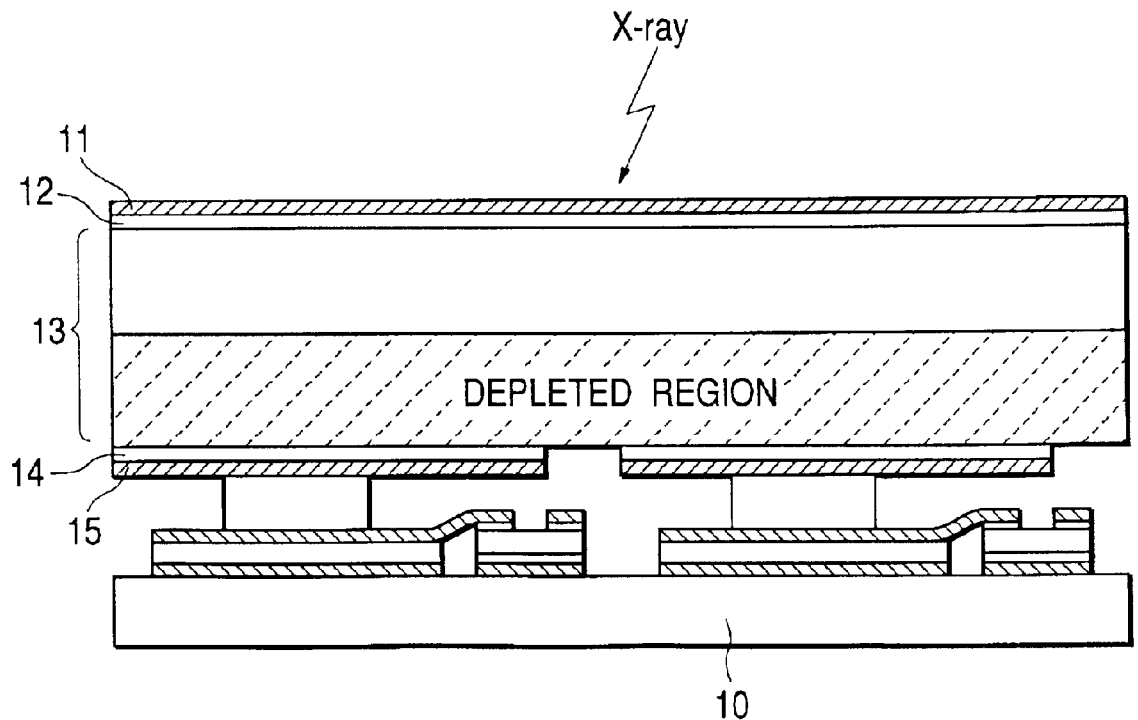
FIG. 7 is a sectional view of pixels of an X-ray area sensor in the third embodiment of the present invention.

The third embodiment of the present invention will be described next. The present embodiment is an example of the X-ray area sensor driven by matrix driving. FIG. 7 is a sectional view of the sensor and FIG. 8 an equivalent circuit diagram thereof. The operation of the part for receiving X-rays and absorbing them to generate a signal charge is similar to that in the foregoing first and second embodiments. A point of particular focus in the present embodiment is that the upper electrode 11, the p-layer 12, and the semiconductor layer 13 are common to pixels. On the other hand, n-layers 14 and lower electrodes 15 are individually provided to be connected to respective TFTs and storage capacitors through connecting bumps.

Figure 8:
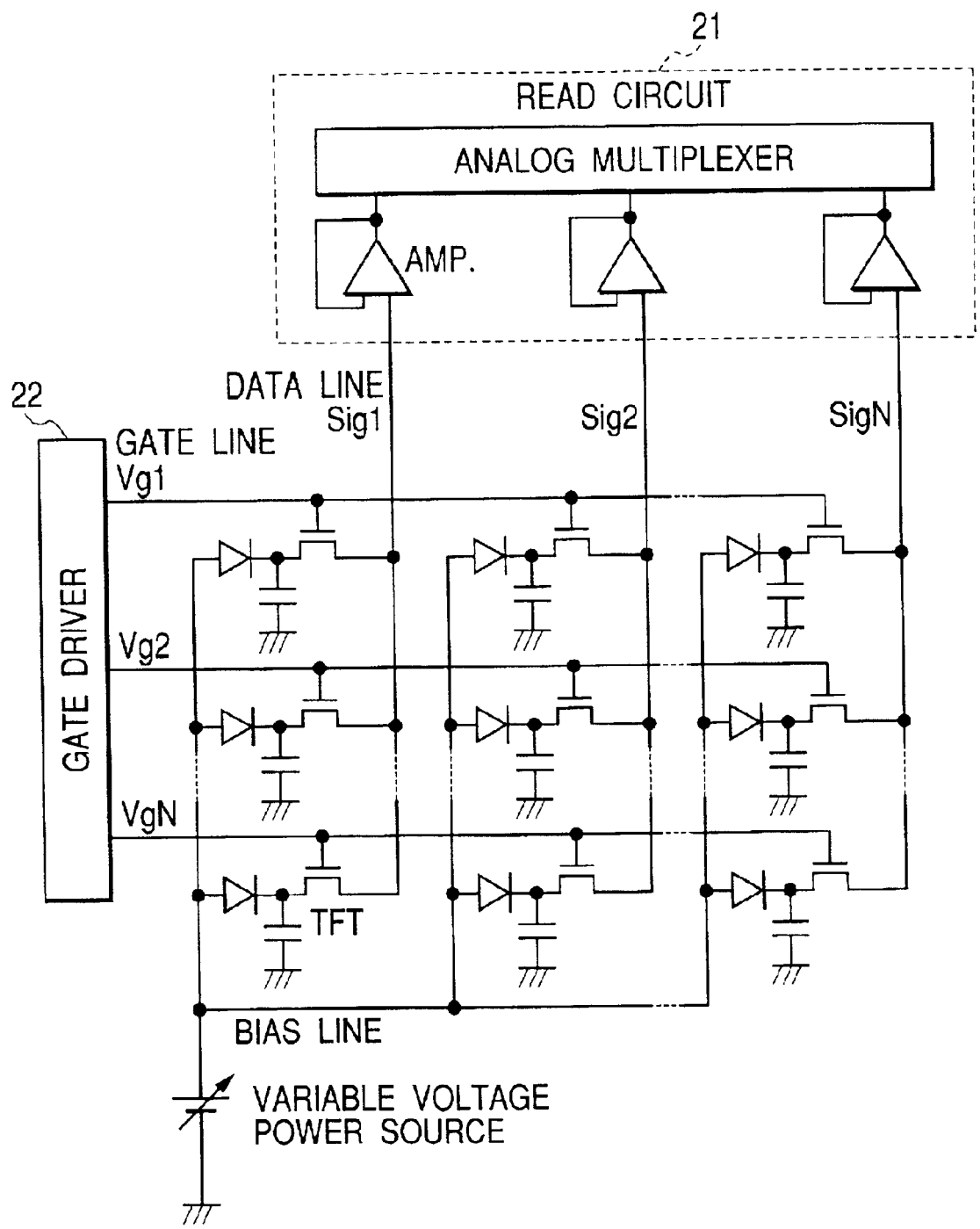
FIG. 8 is an equivalent circuit diagram of the X-ray area sensor in the third embodiment of the present invention.

As shown in FIG. 8, the source electrodes of the respective TFTs are connected to common data lines and the common data lines are connected to a read circuit 21 comprised of amplifiers, an analog multiplexer, and so on. The gate electrodes of the respective TFTs are connected to common gate lines and the common gate lines are connected to a gate driver 22 comprised of a shift register (not shown) or the like. The upper common electrode is connected to a bias line and is further connected to the variable voltage source. The configuration of the present embodiment permits readout of two-dimensional X-ray image information.

(Fourth Embodiment)

Figure 9:
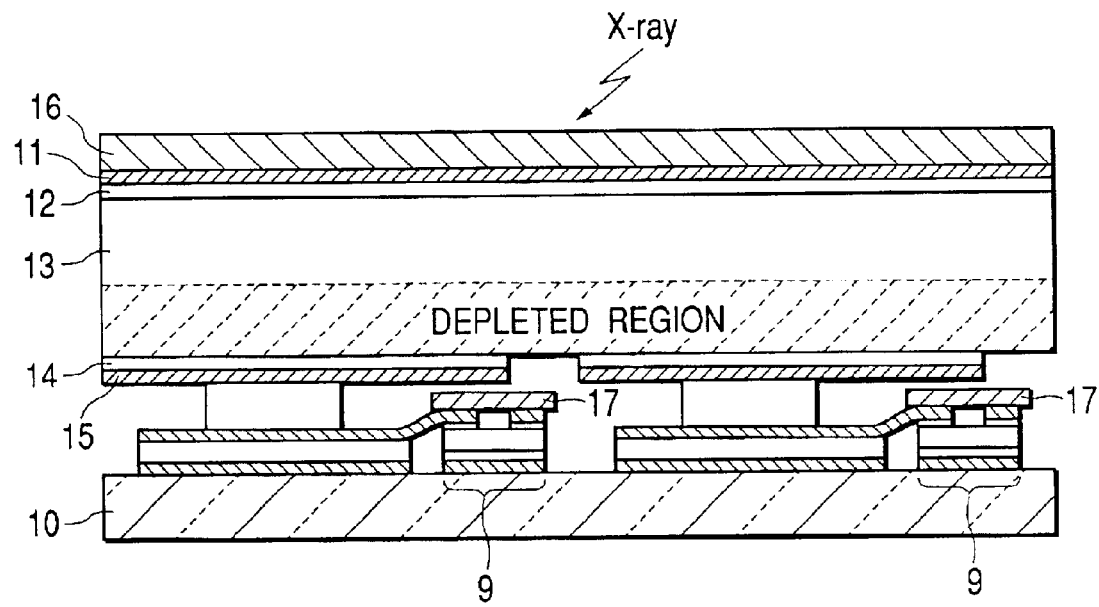
FIG. 9 is a sectional view of pixels of an X-ray area sensor in the fourth embodiment of the present invention.

The fourth embodiment of the present invention will be described next. FIG. 9 is a sectional view of the fourth embodiment of the X-ray sensor of the present invention. The present embodiment is an example of the X-ray area sensor driven by matrix driving as in the third embodiment. More specifically, the present embodiment is an example wherein there are provided an aluminum film 16 intended for absorption of the scattered X-rays on the X-ray incidence side and radiation shielding members 17 of lead or the like intended for removal of the transmitted X-rays on the TFTs 9. By providing the aluminum film 16 or the like for absorbing 50% or more of X-rays of the energy not more than 20 keV as in the present configuration, it becomes feasible to weaken the electric field applied to the semiconductor layer 13 and to absorb and remove the scattered X-rays efficiently. By providing the radiation shielding members 17 of lead or the like on the TFTs 9, it becomes feasible to prevent malfunctions of the TFTs 9, leakage, and the like due to the transmitted X-rays. Although the present embodiment is provided with both the aluminum film 16 and the radiation shielding members 17, it is also possible to employ either one of them. The materials do not have to be limited to aluminum and lead, either, and other materials having like effects may be applied.

(Fifth Embodiment)

Figure 10:
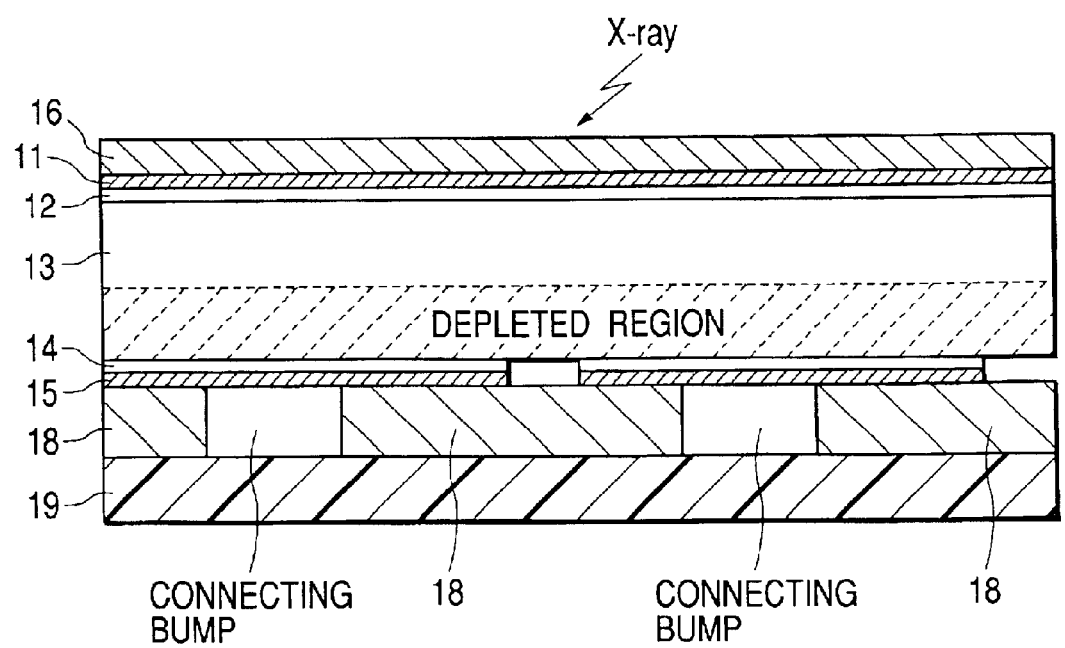
FIG. 10 is a sectional view of pixels of an X-ray area sensor in the fifth embodiment of the present invention.

The fifth embodiment of the present invention will be described next. FIG. 10 is a sectional view of the fifth embodiment of the X-ray sensor according to the present invention. The present embodiment is different from the fourth embodiment in that the X-ray sensor is not placed on a glass substrate, but is placed on a crystal silicon substrate 19. On the crystal silicon substrate 19 there are provided CCDs, C-MOS switching devices, capacitors, etc. though not illustrated. By providing the aluminum film 16 or the like as in the present configuration, it becomes feasible to weaken the electric field applied to the semiconductor layer 13 and to absorb and remove the scattered X-rays efficiently. By providing the radiation shielding members 18 of lead or the like on the crystal silicon substrate 19, it becomes feasible to prevent the malfunctions, the leakage, and the like due to the transmitted X-rays. In general, crystal silicon absorbs more X-rays than amorphous silicon and polysilicon and is thus susceptible to the influence of the scattered X-rays and transmitted X-rays, so as to cause malfunctions in certain cases. The provision of the aluminum film 16 intended for removal of the scattered X-rays and the radiation shielding members 18 as in the present embodiment is fairly effective particularly in the case of the crystal silicon substrate being used. Although the present embodiment is provided with both the aluminum film 16 and the radiation shielding members 18, it is also possible to employ either one of them. The materials do not have to be limited to aluminum and lead, either, and other materials having like effects may also be used.

(Sixth Embodiment)

Figure 11:
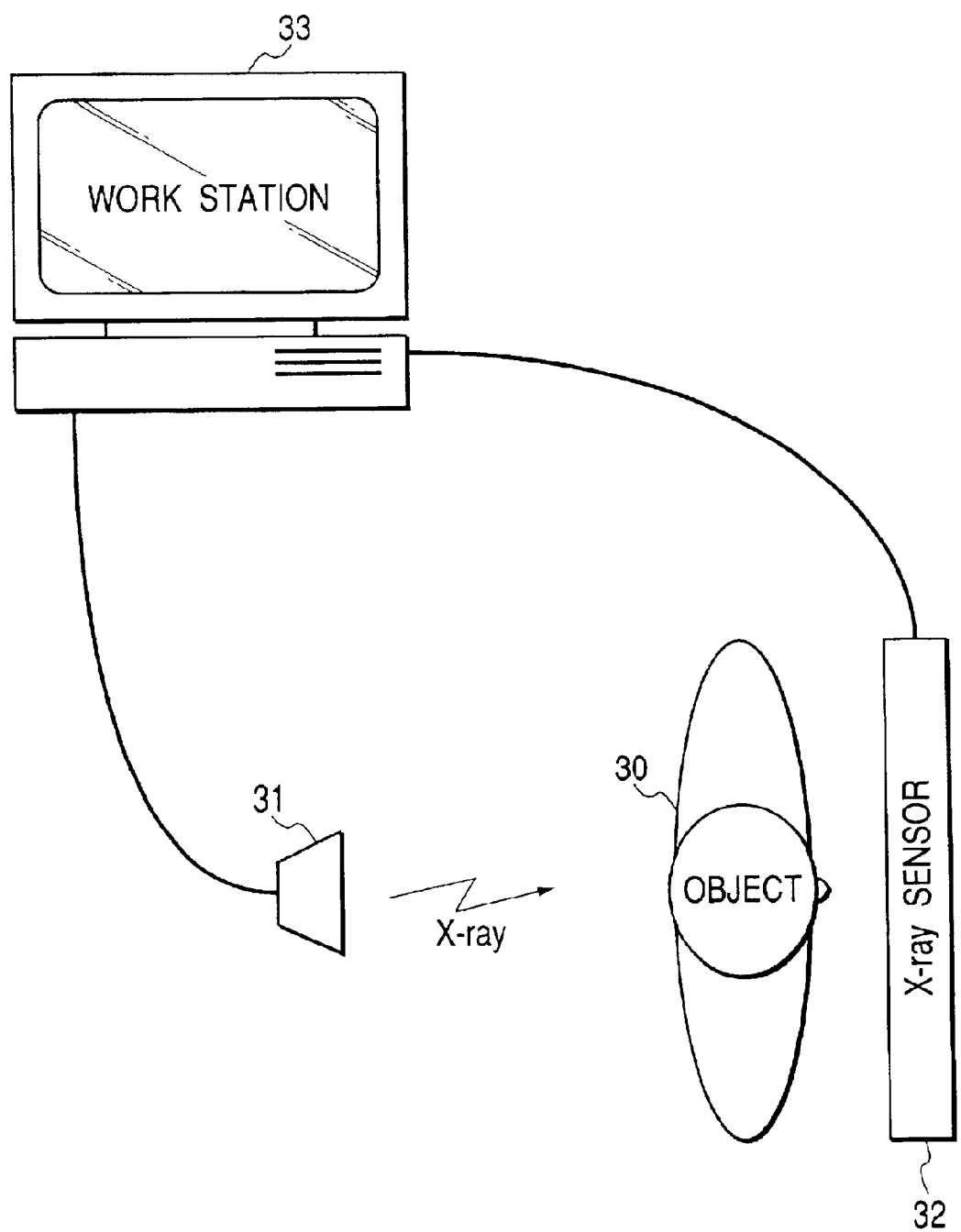
FIG. 11 is an illustration showing an X-ray photographing system in the sixth embodiment of the present invention.
Figure 14:
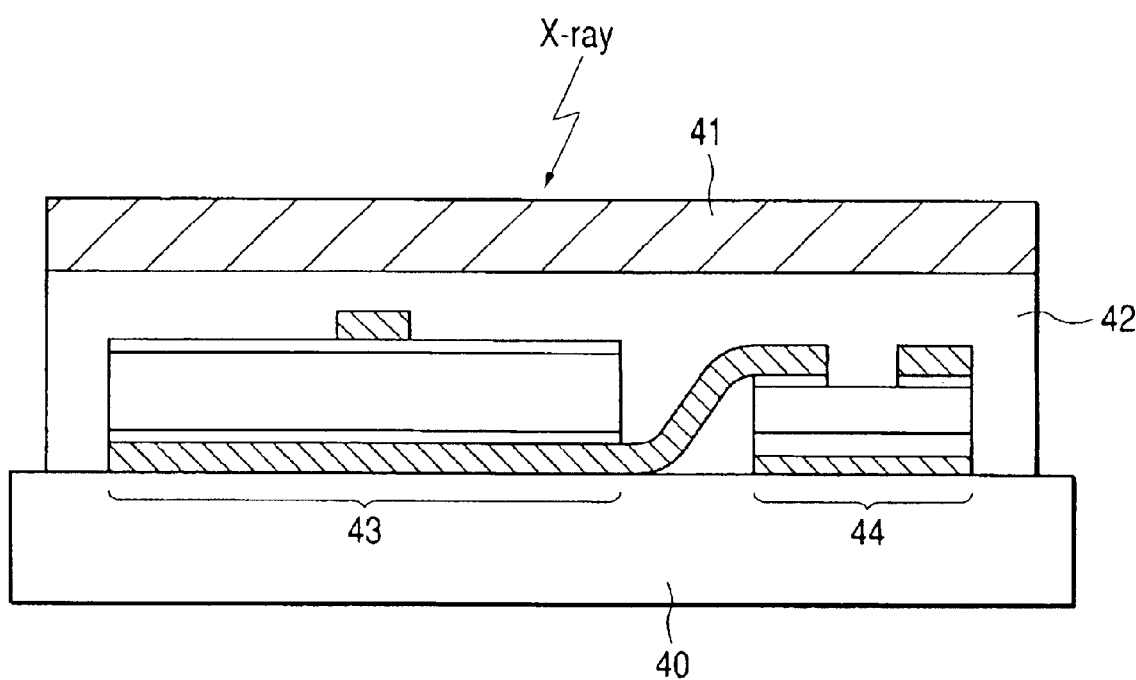
FIG. 14 is a sectional view of a pixel in a conventional X-ray sensor.
Figure 15:
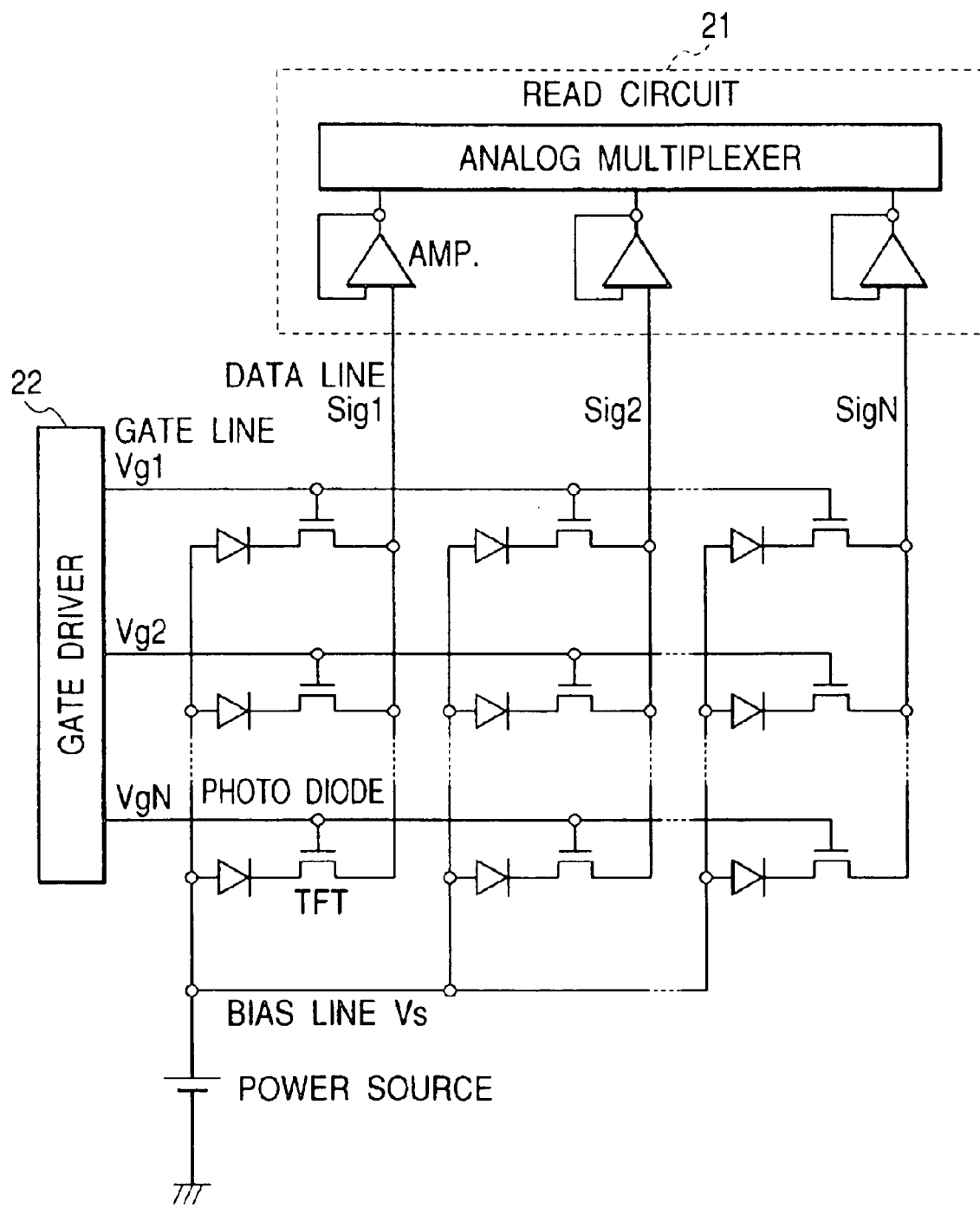
FIG. 15 is an equivalent circuit diagram of a conventional X-ray sensor.
Figure 16:
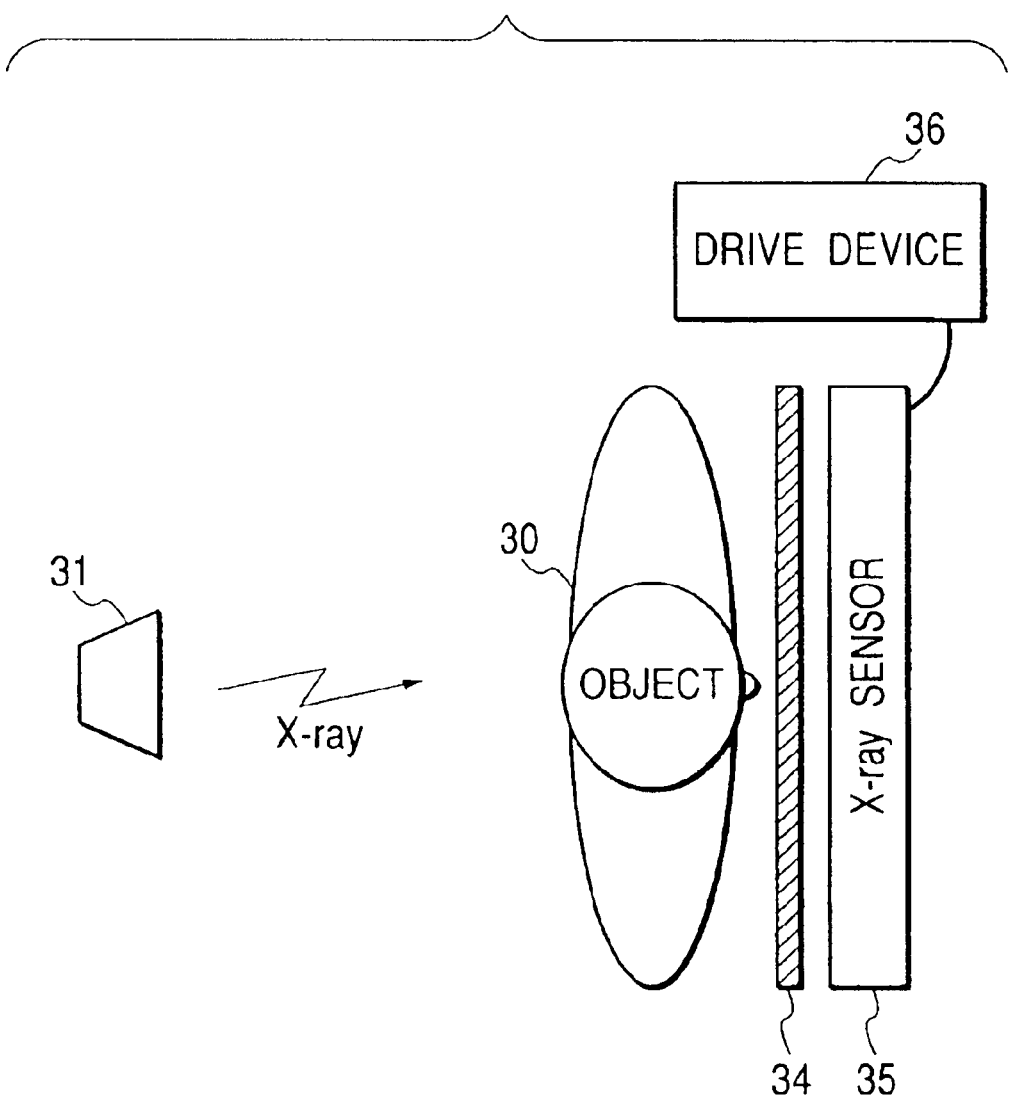
FIG. 16 is an illustration showing a conventional X-ray photographing system.

The sixth embodiment of the present invention will be described next. The present embodiment is an X-ray photographing system using the X-ray sensor of the present invention. FIG. 11 is a schematic representation showing the configuration of the X-ray photographing system of the present embodiment. The X-ray photographing system of the present embodiment is comprised of an X-ray generator 31, the X-ray sensor 32 described in Embodiments 1 to 3, and a work station 33 connected thereto. The work station 33 has a function of entering photography information, a function of performing control on driving of the X-ray generator 31 and the X-ray sensor 32 according to the input photography information, a function of performing an arithmetic operation of processing an acquired image, and a function of displaying an image.

FIGS. 12 and 13 are examples of algorithms for the control on driving of the X-ray sensor according to the present invention. In the example of FIG. 12 the thickness of the depletion layer of the X-ray sensor 32 is controlled by the tube voltage of the X-ray generator 31, which is inputted into the work station 33. Namely, photographing conditions are first inputted (ST1). When the tube voltage of the X-ray generator 31 is higher than a set value (ST2), the voltage applied to the X-ray sensor 32 is set at a lower value (ST3) to increase the non-depleted region, thereby decreasing the influence of the scattered X-rays. When the tube voltage is lower than the set value (ST2), the voltage applied to the X-ray sensor 32 is set at a higher value (ST4). It is also possible to provide a separate phototimer to monitor energy values of X-rays and feed the measured energy values back to the control. In this case, the phototimer is desirably configured to be able to resolve photon energy levels determined by wavelengths (frequencies) of X-rays.

In the example of FIG. 13 the thickness of the depletion layer of the X-ray sensor is controlled by information about the object, which is inputted into the work station. Namely, the object information is inputted (ST1). When the density (specific gravity) of the object is greater than a set value (ST12), the object can produce a greater amount of scattered X-rays and thus the voltage to the X-ray sensor 32 is set at a lower value (ST13) to increase the nondepleted region, thereby decreasing the influence of the scattered X-rays. When the density of the object is smaller than the set value (ST12), the voltage to the X-ray sensor 32 is set at a higher value (ST14).

In the case of the object being a human body, it is desirable to employ more complex control than in the above examples. Namely, it is desirable to set an optimal voltage applied to the X-ray sensor on the basis of both the photographing part (e.g., a limb, a chest region, or the like) corresponding to the density, and the tube voltage.

In the X-ray photographing system of the present embodiment a plurality of X-ray images can be acquired while varying the tube voltage of the X-ray generator or the voltage applied to the X-ray sensor. By arithmetically processing these acquired images in the work station, it is feasible to obtain an image resulting from the arithmetic operation of these images. This function can be applied to acquisition of diagnostic imagery such as energy subtraction or the like.

What is claimed is:

1. A radiation detecting apparatus for detecting radiation that has passed through an object, said apparatus comprising:
   a radiation-entrance surface
   a conversion element having a semiconductor layer for directly converting the radiation that has passed through the object into electrical charge; and
   a variable voltage source for applying an electric field to said semiconductor layer to produce a depletion layer and a non-depleted region, the non-depleted region being toward the radiation-entrance surface,
   wherein the variable voltage source applies a voltage of a plurality of values such as to apply at least electric fields in an identical direction and in different strengths.

2. The radiation detecting apparatus according to claim 1, wherein said conversion element has a stacked structure of a p-type semiconductor layer, a semiconductor layer, and an n-type semiconductor layer.

3. The radiation detecting apparatus according to claim 2, wherein the radiation-entrance surface is adjacent to the p-type semiconductor layer.

4. The radiation detecting apparatus according to claim 1, wherein said conversion element has a stacked structure of a p-type semiconductor layer, a semiconductor layer, and an insulating layer.

5. The radiation detecting apparatus according to claim 1, wherein said semiconductor layer contains one selected from amorphous selenium, lead iodide, mercury iodide, gallium arsenide, gallium phosphide, CdZn, and CdZnTe.

6. The radiation detecting apparatus according to claim 1, further comprising a switching device, wherein said switching device is a thin film transistor.

7. The radiation detecting apparatus according to claim 6, wherein said thin film transistor is comprised of amorphous silicon or polysilicon.

8. The radiation detecting apparatus according to claim 1, further comprising a switching device, wherein said switching device is made of a material of crystalline silicon, and wherein radiation shielding means is further provided between said switching device and said semiconductor layer.

9. The radiation detecting apparatus according to claim 1, wherein a scattered-radiation absorbing layer is provided on said radiation-entrance surface.

10. The radiation detecting apparatus according to claim 9, wherein said scattered-radiation absorbing layer is a filmlike aluminum material.

11. The radiation detecting apparatus according to claim 1, further comprising control means connected to said variable voltage source and configured to control voltages, wherein said control means varies the voltages of said variable voltage source to change thickness of said depletion layer.

12. The radiation detecting apparatus according to claim 11, wherein said control means has a function of controlling the voltages of said variable voltage source to apply such an electric field that said non-depleted region in said semiconductor layer absorbs at least 50% or more of radiation with energy of not more than 20 keV.

13. A radiographing system comprising:
   a radiation generating apparatus for generating radiation;
   the radiation detecting apparatus as set forth in claim 11; and
   photographing information input means for inputting a photographing condition and object information into the control means of the radiation detecting apparatus,
   wherein said control means controls said variable voltage source according to the inputted photographing condition or object information to change thickness of said non-depleted region in said semiconductor layer.

14. The radiographing system according to claim 13, wherein said photographing condition inputted into said photographing information input means includes at least an X-ray tube voltage of said radiation generating apparatus.

15. The radiographing system according to claim 13, wherein said control means controls said variable voltage source so that when an X-ray tube voltage of said radiation generating apparatus is higher than a set value, said non-depleted region in said semiconductor layer is expanded and so that when the X-ray tube voltage is lower than the set value, said non-depleted region in said semiconductor layer is reduced.

16. The radiographing system according to claim 13, wherein the object information inputted into said photographing information input means includes at least information about a specific gravity of the object.

17. The radiographing system according to claim 16, wherein said control means controls said variable voltage source so that when the specific gravity of the object is greater than a set value, said non-depleted region in said semiconductor layer is expanded and so that when said specific gravity is smaller than the set value, said non-depleted region in said semiconductor layer is reduced.

18. The radiographing system according to claim 13, wherein the object information inputted into said photographing information input means includes at least information about a photographing part of the object.

19. The radiographing system according to claim 13, comprising image processing means for processing an image signal from said radiation detecting apparatus,
   wherein said image processing means acquires a plurality of images with change in either or both of said non-depleted region in said semiconductor layer and an x-ray tube voltage of said radiation generating apparatus and performs image processing of said plurality of images, thereby to obtain an output image.

20. The radiation detecting apparatus according to claim 1, wherein said variable voltage source applies the voltages so as to form said depletion layer in said semiconductor layer from a side opposite to said radiation-entrance surface.

21. A radiation detecting system for detecting a radiation image formed by radiation that has passed through an object, said system comprising:

a radiation generating apparatus for irradiating the object with the radiation; and a radiation detecting apparatus as set forth in claim 1.

22. A radiographing apparatus for detecting a radiation image formed by radiation that has passed through an object, said apparatus comprising:

a radiation-entrance surface;

a conversion element having a semiconductor layer for directly converting the radiation that has passed through the object into electrical charge; and a power supply for applying a voltage so as to form a depletion layer in said semiconductor layer to produce a depletion layer and a non-depleted region, the non-depleted region being toward the radiation-entrance surface of said semiconductor layer.

23. A radiographing system for detecting and recording a radiation image formed by radiation that has passed through an object, said system comprising:

a radiation generating apparatus for irradiating the object with the radiation; and a radiographing apparatus as set forth in claim 22.

* * * * *

UNITED STATES PATENT AND TRADEMARK OFFICE
CERTIFICATE OF CORRECTION

PATENT NO.    : 6,795,525 B2
DATED         : September 21, 2004
INVENTOR(S)   : Toshio Kameshima It is certified that error appears in the above-identified patent and that said Letters Patent is hereby corrected as shown below:

Column 7,
Line 28, "surface" should read -- surface; --.

Column 8,
Line 61, "x-ray" should read -- X-ray --.

Signed and Sealed this

Twelfth Day of July, 2005

JON W. DUDAS
*Director of the United States Patent and Trademark Office*